United States Patent
Logelin

(10) Patent No.: US 11,804,825 B1
(45) Date of Patent: Oct. 31, 2023

(54) SYSTEM AND METHOD OF COMPENSATING FOR VOLTAGE AND TEMPERATURE VARIATIONS IN COMMUNICATION LINK

(71) Applicant: Keysight Technologies, Inc., Santa Rosa, CA (US)

(72) Inventor: Donald M. Logelin, Divide, CO (US)

(73) Assignee: KEYSIGHT TECHNOLOGIES, INC., Santa Rosa, CA (US)

(*) Notice: Subject to any disclaimer, the term of this patent is extended or adjusted under 35 U.S.C. 154(b) by 0 days.

(21) Appl. No.: 17/839,653

(22) Filed: Jun. 14, 2022

Related U.S. Application Data

(60) Provisional application No. 63/347,301, filed on May 31, 2022.

(51) Int. Cl.
*H03K 3/011* (2006.01)
*H03K 5/133* (2014.01)

(52) U.S. Cl.
CPC .............. *H03K 3/011* (2013.01); *H03K 5/133* (2013.01)

(58) Field of Classification Search
CPC ................................ H03K 3/011; H03K 5/133
See application file for complete search history.

(56) References Cited

U.S. PATENT DOCUMENTS

| | | |
|---|---|---|
| 7,222,036 B1 | 5/2007 | Thorne |
| 8,189,723 B2 | 5/2012 | Berhanu et al. |
| 8,229,049 B1 | 7/2012 | Logue |
| 9,059,716 B1 | 6/2015 | Nagarajan et al. |
| 9,898,433 B2 | 2/2018 | Lee et al. |
| 10,630,272 B1* | 4/2020 | Ashtiani ............... H03K 5/133 |

OTHER PUBLICATIONS

"Native High-Speed I/O Interfaces", XILINX, XAPP1274 (v1.2) Sep. 6, 2019, www.xilinx.com, pp. 1-71.
Jim Tatsukawa, "Asynchronous Data Capture Using the High Speed SelectIO Wizard", XILINX, XAPP1330 (v1.1) Aug. 3, 2018, www.xilinx.com, pp. 1-21.

* cited by examiner

*Primary Examiner* — Jeffrey M Shin

(57) ABSTRACT

A system and method compensate for voltage and temperature variations in a pseudo synchronous communication link. The method includes receiving a data signal at a DLL through first and second variable delay circuits for performing eye tracking, keeping a sample point of the data signal in the center of a data eye having a UI; initially determining a tap size for taps of the first and second variable delay circuits; automatically selecting a number of taps of a third variable delay circuit that provides a specified delay time equal to a time value of the UI; automatically adjusting the number of taps in response to changes in the tap size; determining how many taps are equal to one half of the time value of the UI; and adjusting the number of the taps of the first and second variable delay circuits using the adjusted number of taps.

20 Claims, 4 Drawing Sheets

SYSTEM AND METHOD OF COMPENSATING FOR VOLTAGE AND TEMPERATURE VARIATIONS IN COMMUNICATION LINK

CROSS-REFERENCE TO RELATED APPLICATIONS

This present application is claims priority under 35 U.S.C. § 119(e) from U.S. Provisional Application 63/347,301 filed on May 31, 2022, which names Donald M. Logelin as inventor. The entire disclosure of U.S. Provisional Application 63/347,301 is specifically incorporated herein by reference.

BACKGROUND

Communication systems increasingly rely on high-speed data links, such as Peripheral Component Interconnect (PCI), PCI eXtensions for Instrumentation (PXI), and PXI Express (PXIe) high speed data networks. Such high-speed data links may be pseudo synchronous communication links for data sampling, which include delay locked loops (DLLs) for performing eye tracking to provide data and clock recovery of the data signals in response to common clock signals. Conventional designs of such high-speed data links, using for example Xilinx® XAPP1330 (v1.1), "Asynchronous Data Capture Using the High Speed SelectIO Wizard" (Aug. 3, 2018) or Xilinx® XAPP1274 (v1.2), "Native High-Speed I/O Interfaces" (Sep. 7, 2019), available from Advanced Micro Devices, Inc., are prone to sampling error due to delay drift of delay circuits used for the DLLs of the data sampling circuit. The delay drift may result from process, voltage, and temperature (PVT) variations, for example. Two types of errors associated with the delay drift are sample position error and adjustment resolution error, the presence of which results in the DLL no longer sampling the data signals in the center of the data eye.

Each delay circuit used in the DLL has a number of equal sized "taps" and a "tap size" indicating delay time per tap. The amount of delay from input to output of each delay circuit is determined by the selected tap and the tap size. The delay circuit tap size, in particular, is initially determined only during calibration at circuit initialization time. Determining the tap size therefore accounts for process variations of the PVT variations but does not compensate for delay drift due to voltage and temperature variations in the tap size, which can be as high as ±40 percent. Errors due to the voltage and temperature delay drift are generally ignored, largely based on the assumption that implementations of the delay circuits of the DLLs have sufficient timing margins over the expected operating temperature and voltage such that these errors would be insignificant.

For example, using a Xilinx® UltraScale+ field programmable gate array (FPGA), available from Advanced Micro Devices, Inc. and Xilinx documents XAPP1330 (v1.1) or XAPP1274 (v1.2), for which the tap size may vary from 2.1 picoseconds (ps)/tap to 12 ps/tap, a high speed data link running at 1200 MHz results in a unit interval (UI) for eye tracking by a DLL of 833 ps. The number of taps of a delay circuit per UI can vary from 397 to 64. If the tap size (delay per tap) is initially 7.0 ps, the number of taps of the UI is 119 or about 60 for ½ of the UI. The tap size could drift to be as low as 4.2 ps and as high as 9.8 ps. Therefore, without correcting for voltage and temperature variations, the 60 taps initially corresponding to ½ of the UI could result in a delay anywhere from 252 ps to 588 ps, or a variation of 336 ps which represents 0.40 UI of sampling error.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
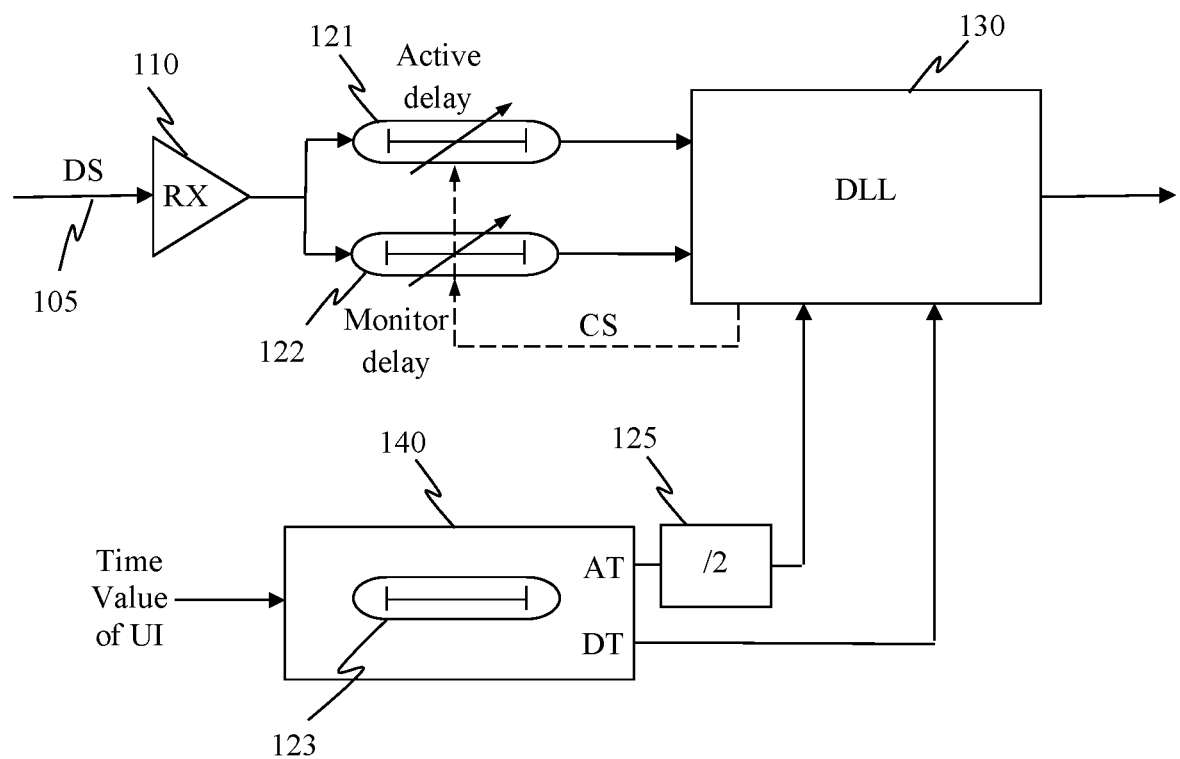
FIG. 1 is a simplified block diagram of a system for compensating for voltage and temperature variations in a pseudo synchronous communication link, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if a sensor device (e.g., a probe) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, according to various embodiments, a system and method of operating the system are provided that continuously track delay tap size of taps in variable delay circuits of a DLL over voltage and temperature variations using a delay tap monitor. The delay tap monitor supplies the DLL with a continuously compensated value for adjusting the variable delay circuits to maintain calibrated delay times. Also, adjustment resolution of the DLL may be changed based on the adjusted delay tap sizes to minimize adjustment resolution errors.

According to a representative embodiment, a system is provided for compensating for voltage and temperature variations in a pseudo synchronous communication link, including a delay lock loop (DLL) in the pseudo synchronous communication link and a delay tap monitor connected to the DLL. The DLL is configured to perform eye tracking on a data signal, keeping a sample point of the data signal in a center of a data eye to provide data and clock recovery of the data signal in response to a common clock signal, where a unit interval (UI) of the data eye is defined as a reciprocal of a data rate (1/data rate) of the data signal. The DLL receives the data signal via a first variable delay circuit and a second variable delay circuit for implementing corresponding delays of the data signal, each of the first and second variable delay circuits having multiple taps for adjusting the corresponding delays, and each tap having a tap size providing a delay time per tap, where the tap size varies in response to the voltage and temperature variations. The DLL maintains a delay separation of ½ of the UI between the corresponding delays of the first and second variable delay circuits by adjusting a number of taps of the first and second variable delay circuits, respectively, based on the tap size so that a difference between the corresponding delays is equal to the delay separation. The delay tap monitor includes another variable delay circuit having multiple taps, each tap having a tap size indicating a delay time per tap, where the tap size of the delay tap monitor varies in response to the voltage and temperature variations in substantially the same manner as the tap size of the first and second variable delay circuits varies in response to the voltage and temperature variations. The delay tap monitor is configured to maintain a specified delay time equal to a time value of the UI by automatically adjusting a number of taps of the multiple taps in the another variable delay circuit needed to provide the specified delay time as the tap size varies in response to the voltage and temperature variations. The delay tap monitor provides to the DLL an adjusted number of taps equal to a number of taps corresponding to the specified delay time or ½ of the number of taps corresponding to the specified delay time. The DLL adjusts the number of taps of the first and second variable delay circuits, respectively, using the adjusted number of taps provided by the delay tap monitor to compensate for the voltage and temperature variations in order to maintain the delay separation of ½ of the UI between the corresponding delays of the first and second variable delay circuits.

According to another representative embodiment, a method is provided for compensating for voltage and temperature variations in a pseudo synchronous communication link. The method includes receiving a data signal over the pseudo synchronous communication link at a differential input of a DLL through first and second variable delay circuits, respectively, for performing eye tracking of the data signal at the DLL, keeping a sample point of the data signal in a center of a data eye, wherein a unit interval (UI) of the data eye is defined as a reciprocal of a data rate (1/data rate) of the data signal; initially determining a tap size for taps of the first and second variable delay circuits at an initial process, voltage and temperature (PVT) conditions; receiving a time value of the UI at a third variable delay circuit in a delay tap monitor, where the third variable delay circuit is substantially the same as the first and second variable delay circuits; automatically selecting a number of taps of the third variable delay circuit that provides a specified delay time equal to the time value of the UI based on the tap size of the taps; automatically adjusting the number of taps of the third variable delay circuit that provides the specified delay time equal in response to changes in the tap size of the third variable delay circuit, and outputting the adjusted number of taps; receiving information from the third variable delay circuit at the DLL about the adjusted number of taps, enabling the DLL to determine how many taps currently are equal to one half of the time value of the UI; and adjusting a number of the taps of each of the first and second variable delay circuits using the adjusted number of taps to maintain a delay separation of ½ of the UI between first and second delays of the first and second variable delay circuits, wherein adjusting the number of taps takes into account variations in the tap size of the first and second variable delay circuits in order to compensate for variations in voltage and temperature from the initial PVT conditions.

According to another representative embodiment, a system is provided for compensating for voltage and temperature variations in a pseudo synchronous communication link. The system includes a first variable delay circuit connected to a DLL in the pseudo synchronous communication link, and configured to implement a first delay of a data signal input to the DLL, where the DLL is configured to perform eye tracking on the data signal, where a UI of a data eye is defined as a reciprocal of a data rate of the data signal; a second variable delay circuit connected to the DLL, and configured to implement a second delay of the data signal input to the DLL; and a third variable delay circuit connected to the DLL, and configured to maintain a specified delay time equal to a time value of the UI. Each of the first, second and third variable delay circuits has multiple taps for adjusting corresponding delays, and each tap has a tap size providing a delay time per tap, where the tap size varies in response to the voltage and temperature variations. The third variable delay circuit automatically adjusts a number of taps of the plurality of taps needed to provide the specified delay time as the tap size varies in response to the voltage and temperature variations. The third variable delay circuit provides to the DLL an adjusted number of taps corresponding to the specified delay time or ½ of the adjusted number of taps corresponding to the specified delay time. The DLL adjusts the number of taps of the first and second variable delay circuits, respectively, using the adjusted number of taps provided by the third variable delay circuit to compensate for the voltage and temperature variations in order to maintain a delay separation of ½ of the UI between the corresponding delays of the first and second variable delay circuits.

FIG. 1 is a simplified block diagram of a system for compensating for voltage and temperature variations in a pseudo synchronous communication link, according to a representative embodiment.

Referring to FIG. 1, system 100 is included in a pseudo synchronous communications link for receiving high speed data. The system 100 includes a receive (RX) buffer 110, a first variable delay circuit 121, a second variable delay circuit 122, and DLL 130. The RX buffer 110 is configured to buffer a data signal received over a high-speed data link 105. For example, the system 100 may be part of a plug-in receive module of a test system assembled in a PXI or PXIe chassis, and the data link 105 may be coming from a backplane connector or directly from another plug-in transmit module.

The buffered data signal is split, and input to the first and second variable delay circuits 121 and 122. In an embodiment, the first and second variable delay circuits 121 and 122 may correspond to differential inputs to the DLL 130, where the DLL 130 uses one side of the differential input (through the first variable delay circuit 121) to sample the data signal and the other side of the differential input (through the second variable delay circuit 122) to detect whether transitions of the data signal are occurring early or late. The first variable delay circuit 121 implements a corresponding first delay of the data signal, which may be referred to as active delay, for sampling the data signal, and the second variable delay circuit 122 implements a corresponding second delay, which may be referred to as monitor delay, for detecting timing of transitions of the data signal.

Each of the first and second variable delay circuits 121 and 122 has multiple taps for adjusting the corresponding first and second delays. Each tap has a tap size that provides a delay time per tap. As mentioned above, the tap size indicates delay time per tap, and it varies in response to the voltage and temperature variations over time. The tap size may be determined during calibration of the system 100 before being placed in operation, e.g., performing equipment tests. The initial values of the first and second delays are set by the DLL 130. The first and second delays are respectively implemented by the first and second variable delay circuits 121 and 122 using the tap from among the multiple taps of each that provides the determined initial delays based on the tap size.

Notably, the first and second variable delay circuits 121 and 122 are substantially the same, so the tap sizes also will be the same. The tap size of both the first and second variable delay circuits 121 and 122 varies in response to the voltage and temperature variations over the course of operation. Conventional systems do not compensate for this variation, as discussed above.

The DLL 130 is configured to perform eye tracking on the data signal. Performing the eye tracking includes keeping a sample point of the data signal in a center of a data eye to provide data and clock recovery on the data signal in response to a common clock signal. The DLL 130 includes a phase detector for detecting deviation of a data sample point from nominal in the data signal. The first and second variable delay circuits 121 and 122 are controlled by the DLL 130 to reposition the data sample point to the center of the data eye, which is the nominal sampling point. The DLL 130 may be any compatible DLL circuit. The DLL 130, as well as the first and second variable delay circuits 121 and 122 may be provided in an application specific integrated circuit (ASIC) or a field programmable gate array (FPGA), for example, such as a Xilinx® UltraScale+ FPGA, available from Advanced Micro Devices, Inc., for example.

Figure 2:
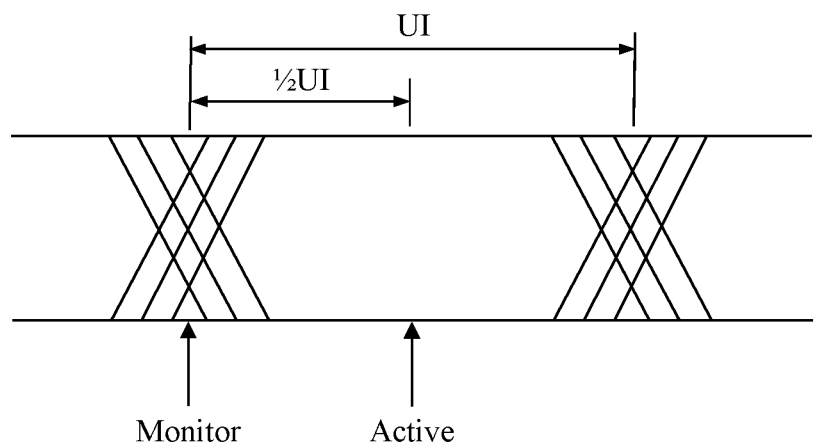
FIG. 2 is a diagram of a data eye generated by the system for performing eye tracking, according to a representative embodiment.

FIG. 2 is a diagram of a data eye generated by the DLL 130, for purposes of illustration, according to a representative embodiment. Referring to FIG. 2, a unit interval (UI) of the data eye for the data signal corresponds to the eye opening, which is one bit period of the data signal or the reciprocal of a data rate (1/data rate) of the data signal. During operation, the DLL 130 is configured to maintain a delay separation of ½ of the UI (over voltage and temperature variations) between the two copies of the data signal delivered to the DLL 130 after passing through first and second variable delay circuits 121 and 122 respectively, using techniques that would be apparent to one skilled in the art. This keeps the sampling point at the center of the eye opening (indicted by "Active"). According to various embodiments, this delay separation between the first and second delays is maintained by adjusting the number of taps of the first and second variable delay circuits 121 and 122, respectively, as the tap sizes changes as a result of variations in voltage and temperature so that the difference between the corresponding first and second delays remains the same. The second delay of the second variable delay circuit 122 is adjusted to be aligned to the edge of the data transitions (indicated by "Monitor") and the first delay of the first variable delay circuit 121 is adjusted by same amount as well. This mechanism maintains the ½ UI initial separation between the copies of the data signal via first variable delay circuit 121 and the second variable delay circuit 122 entering into the DLL 130. The DLL 130 continuously tracks the transition in incoming data signal (via the second variable delay circuit 122) with respect to the nominal position. As soon as the DLL 130 sees the transition point shift even a little with respect to the nominal position, the DLL 130 starts to adjust the first and second variable delay circuits 121 and 122 by the same amount to reposition the sample point at center of the eye.

Figure 3:
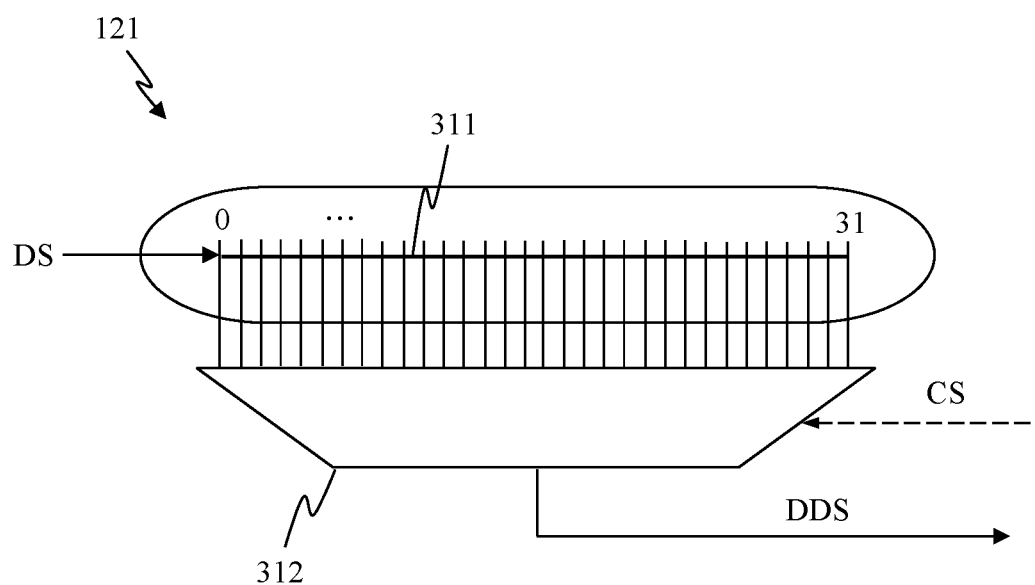
FIG. 3 is a simplified block diagram of the first variable delay circuit controllable by the DLL, according to a representative embodiment.

FIG. 3 is a simplified block diagram of the first variable delay circuit 121 controllable by the DLL 130, according to a representative embodiment. It is understood that the second variable delay circuit 122 is substantially the same as the first variable delay circuit 121, and therefore will not be described separately.

Referring to FIG. 3, the first variable delay circuit 121 includes a delay line 311 with 32 taps and a multiplexer 312 for selecting one of the 32 taps of the delay line 311 under control of the DLL 130. The data signal (DS) is input to the delay line 311 and the delayed data signal (DDS) is output to the DLL 130 at the one of the 32 taps selected by the multiplexer 312 in response to a control signal (CS) received from the DLL 130. The control signal identifies the number of taps to be selected by each of the first and second variable delay circuits 121 and 122 in order to maintain the delay separation of ½ UI and the sampling point at the center of the eye across voltage and temperature variations. When the delay line 311 has 32 taps, as in this example, the control signal may be a five bit control signal. Of course, the delay line 311 may have more or fewer taps without departing from the scope of the present teachings.

Referring again to FIG. 1, the system 100 further includes a delay tap monitor 140 connected to the DLL 130, which essentially monitors the variations in voltage and temperature and provides information to the DLL 130 to correct for the effect of the voltage and temperature variations on the first and second variable delay circuits 121 and 122. The delay tap monitor 140 includes a third variable delay circuit 123, which is substantially the same as the first and second variable delay circuits 121 and 122, although it is not configured to actually delay the data signal. For example, the third variable delay circuit 123 may be provided on the same FPGA or ASIC as the first and second variable delay circuits 121 and 122. Therefore, the third variable delay circuit 123 has multiple taps, and each tap has a tap size indicating a delay time per tap, where the tap size of the third variable delay circuit 123 varies in response to the voltage and temperature variations in substantially the same manner as the tap sizes of the first and second variable delay circuits 121 and 122 vary in response to the voltage and temperature variations. When using an FPGA or ASIC, delay differences that may exist across the die may be minimized by placing the delay tap monitor 140 (or by using multiple tap monitors) relatively close to the delays of interest of the first and second variable delay circuits 121 and 122.

The delay tap monitor 140 is configured to maintain a specified delay time equal to the time value of one UI of the data signal by automatically adjusting the number of taps from the multiple taps available in the third variable delay circuit 123 needed to provide the specified delay time as the tap size varies in response to the voltage and temperature variations. This specified delay time is a configuration property of the third variable delay circuit 123. Since it is equal to a UI, it can be a constant number for an implementation or can be made user configurable. Generally, determining the number of taps in a variable delay circuit that would delay a signal by a given value provided to the variable delay circuit and/or devices implementing such a process, would be apparent to one skilled in the art.

As discussed above, since the tap size of the taps varies in response to voltage and temperature variations from the initial tap size established during calibration, the number of taps determined to provide the required specified delay time will also vary in response to the voltage and temperature variations. The delay tap monitor 140 therefore continuously or periodically determines the number of taps that provide the specified delay time equal to the time value of one UI to keep abreast of the voltage and temperature variations occurring since the calibration. The determined number of taps may be referred to as the adjusted number of taps (AT).

The delay tap monitor 140 outputs the adjusted number of taps to the DLL 130 to communicate the number of taps corresponding to one UI. The DLL 130 is able to determine ½ UI from the adjusted number of taps. Alternatively, the system 100 may optionally include a divider 125 configured to divide the adjusted number of taps by two, in which case the DLL 130 does not need to perform the division operation. The DLL 130 now knows how many taps are there in ½ UI. The DLL 130 also knows the current tap value setup in the second variable delay circuit 122 for it to be aligned with the transition in the data signal. The DLL 130 then continuously or periodically determines delay values for the first and second delays of the first and second variable delay circuits 121 and 122 such that the second variable delay circuit 122 stays aligned with the transitions in the data signal (across variations in data signal edge or variations in voltage or temperature) and the first variable delay circuit 121 stays ½ UI apart from the second variable delay circuit 122 so that data sampling can be done at the center of the eye. The DLL 130 also determines the number of taps needed to implement the determined delay values, as is known in the art, and sends control signal (CS) to the first and second variable delay circuits 121 and 122 to program the number of taps in them. Accordingly, first and second variable delay circuits 121 and 122 are able to compensate for the voltage and temperature variations.

As an example, the first, second and third variable delay circuits 121, 122, and 123 and the DLL 130 may be implemented using a Xilinx® UltraScale+ FPGA, as described by Xilinx documents XAPP1330 (v1.1) or XAPP1274 (v1.2), which are hereby incorporated by reference in their entireties. With regard to the third variable delay circuit 123 of the delay tap monitor 140, in particular, delay circuits of the Xilinx® UltraScale+ FPGA have a mode in which a delay time value can be specified, and that specified delay time value will automatically be maintained over voltage and temperature changes by automatically adjusting the number of taps. The number of taps value needed to create the delay time value is available externally as output from the third variable delay circuit 123 as the adjusted number of taps (AT). Therefore, in this example, the delay time value of the third variable delay circuit 123 in the Xilinx® UltraScale+ FPGA may be set equal to one UI of the data signal for it to act as the delay tap monitor 140.

In an embodiment, the delay tap monitor 140 also adjusts a delta number of taps (DT) based on the adjusted number of taps (AT) corresponding to the specified delay time equal to one UI (taps per UI), and provides the adjusted delta number of taps to the DLL 130. The delta number of taps determines the adjustment resolution of the DLL 130, which is the number of taps by which the DLL 130 will change the first and second variable delay circuits 121 and 122, for example. The value of the delta number of taps is determined such that it is large enough so that adjustments to the first and second variable delay circuits 121 and 122 do not occur too slowly making the first and second variable delay circuits 121 and 122 unable to keep up with changes in the number, but small enough so that the first and second variable delay circuits 121 and 122 do not glitch while having delay values programmed in them and/or do not provide non-optimum sampling points (not close to or at the center of the eye). When the DLL 130 changes the number of taps of the first and second variable delay circuits 121 and 122, as discussed above, it does so in amounts equal to the delta number of taps provided by the delay tap monitor 140. The delta number of taps or adjustment resolution may be set initially to a desired value for the DLL 130. Since there is a tradeoff between the adjustment resolution of the DLL 130 and the time it takes for the DLL 130 to reach an optimum sampling point, it may be advantageous to use a delta number of taps greater than one.

The delay tap monitor 140 may provide the delta number of taps (DT) according to Formula (1):

$$DT = \mathrm{Max}\{\mathrm{Floor}[\mathrm{TapsPerUI}/32], 1\} \qquad (1)$$

The adjusted delta number of taps guarantees a certain percentage of resolution of the DLL 130.

Applying the example discussed above to FIG. 1, it may be assumed that the tap size for the first and second variable delay circuits 121 and 122 is initially 10 ps and the adjustment resolution of the DLL 130 is initially fixed at a delta number of taps equal to 8. In this case, the minimum resolution of the DLL 130 would be 80 ps (8 taps*10 ps), meaning that the DLL 130 may have an approximate adjustment resolution error of 10 percent or 0.1 UI due to the limited resolution. By adjusting the resolution of the DLL 130 to a delta number of taps equal to 1, at which the minimum resolution of the DLL 130 would be 10 ps (1 tap*10 ps), the adjustment resolution error can be reduced from about 10 percent to about 1.2 percent.

As another example of resolution adjustment, it may be assumed that the DLL 130 has a minimum resolution of 5 percent of the UI, and that the initial number of taps in first and second variable delay circuits 121 and 122 in the UI is 200 taps. Then the delta number of taps would be a maximum of 10 taps (5 percent of 200) to maintain the resolution at 5 percent or better. When the number of taps per UI changes to 320 taps, for example, by the delay tap monitor 140, the delta number of taps would be adjusted to a maximum of 16 to maintain the minimum resolution of 5 percent of the UI. The delay tap monitor 140 informs the DLL 130 that the delta number of taps is now 16.

The first, second and third variable delay circuits 121, 122 and 123 may be implemented as in one processing unit because their delays (taps per UI) need to be closely matched across voltage and temperature variations. The DLL 130, which is mostly a control unit, may be implemented in the same processing unit as the as first, second and third variable delay circuits 121, 122 and 123 or in a different processing unit. The processing unit(s) here may include FPGA(s) and/or ASIC(s), as discussed above. Alternatively, or in addition, the processing unit(s) may include a general-purpose computer, a central processing unit, one or more processors, microprocessors or microcontrollers, a state machine, a programmable logic device, or combinations thereof (including FPGA(s) and/or ASIC(s)), using any combination of hardware, software, firmware, hard-wired logic circuits, or combinations thereof. As such, the term processing unit encompasses electronic component(s) able to execute a program or machine executable instructions, may be interpreted to include more than one processor or processing core, as in a multi-core processor and/or parallel processors, for example.

The processing unit(s) may communicate with memory for storing instructions used to implement some or all aspects of methods and processes described herein. The memory may be implemented by any number, type and combination of random-access memory (RAM) and read-only memory (ROM), for example, and may store various types of information, such as software algorithms and computer programs, all of which are executable by the processing unit(s). The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of computer readable storage medium known in the art.

Figure 4:
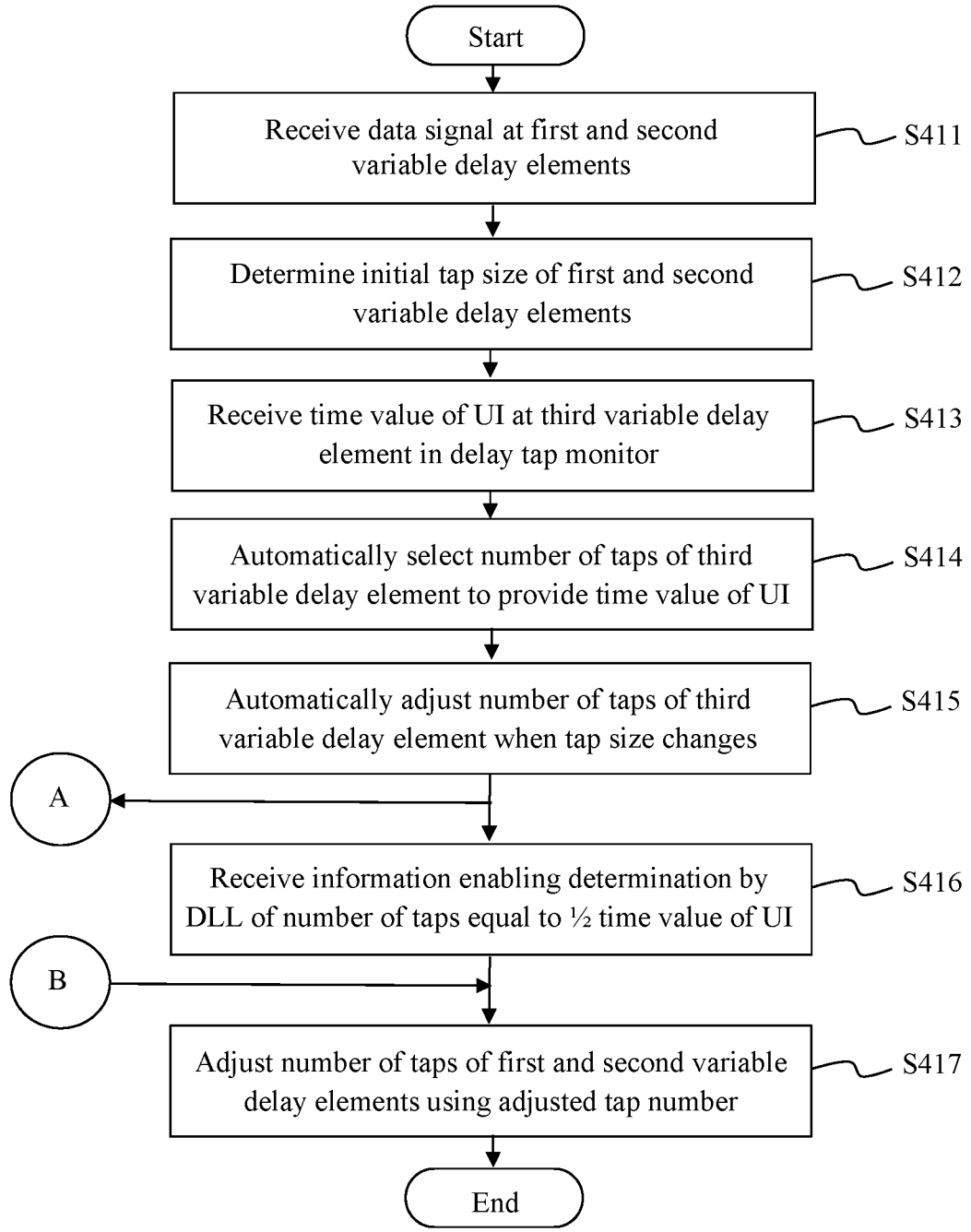
FIG. 4 is a flow diagram of a method for compensating for voltage and temperature variations in a pseudo synchronous communication link, according to a representative embodiment.

FIG. 4 is a flow diagram of a method for compensating for voltage and temperature variations in a pseudo synchronous communication link, according to a representative embodiment. The method may be implemented, for example, using the system 100 discussed above, including the first, second and third variable delay circuits 121, 122 and 123, and the DLL 130.

Referring to FIG. 4, in block S411, a high-speed data signal is received at a differential input of a DLL (e.g., DLL 130) through first and second variable delay circuits (e.g., first and second variable delay circuits 121 and 122) for performing eye tracking. The data signal may be received through a receive buffer (e.g., RX buffer 110) and split between the first and second variable delay circuits. The first variable delay circuit is configured to delay the received portion of the data signal by a first delay and the second variable delay circuit is configured to delay the received portion of the data signal by a second delay.

In block S412, a tap size is initially determined for taps of the first and second variable delay circuits. That is, the DLL adjusts the number of taps of the first and second variable delay circuits to respectively adjust the first and second delays at the initial PVT conditions, such that a sample point of the data signal is at the center of a data eye generated by the DLL. The initial tap size is the delay divided by the number of taps for the variable delay circuit. This may be considered a calibration period. The data eye has a UI corresponding to one bit period of the data signal or the reciprocal of a data rate of the data signal.

In block S413, a time value of the UI of the data eye is received by a third variable delay circuit (e.g., third variable delay circuit 123) in a delay tap monitor (e.g., delay tap monitor 140) connected to the DLL. The third variable delay circuit is substantially the same as the first and second variable delay circuits, except that the delay through the third variable delay circuit is fixed to 1 UI so taps per UI value can be obtained anytime over temperature or voltage variations. For example, these variable delay circuits may be provided on the same FPGA or ASIC. Therefore, the tap sizes of the taps of the third variable delay circuit is assumed to be the same as the tap sizes of the taps of the first and second variable delay circuits.

In block S414, the third variable delay circuit automatically determines a number of taps that provides a specified delay time equal to the time value of the UI, as is known in the art. The number of taps required to provide the time value of the UI is based on the tap size of the taps, which is the same tap size as the first and second variable delay circuits. Automatically determining the number of taps is a feature available in the Xilinx® UltraScale+ FPGA, available from Advanced Micro Devices, Inc., for example. The number of taps is initially based on the initial tap size as determined in block S412, thereby reflecting the initial PVT conditions. However, as voltage and temperature vary during subsequent operation of the DLL, the tap size likewise varies.

Therefore, in block S415, the third variable delay circuit automatically adjusts the number of taps that provides the specified delay time equal to the time value of the UI in response to changes in the tap size of the third variable delay circuit during operation of the DLL. The adjusted number of taps (AT) therefore reflects changes to the tap size caused by variations of voltage and temperature. The adjusted number of taps is output by the third variable delay circuit.

In block S416, the DLL receives information from the third variable delay circuit enabling it to determine how many taps currently are equal to one half of the time value of the UI. The received information may specify the adjusted number of taps divided by two, where a divider is included between the output of the third variable delay circuit and the DLL. Alternatively, the information may specify the adjusted number of taps, in which case the DLL itself divides the adjusted number of taps by two.

In block S417, the number of the taps of each of the first and second variable delay circuits is adjusted by the DLL using the adjusted number of taps to maintain the delay separation of ½ of the UI between the first and second delays of the first and second variable delay circuits. Adjusting the number of taps takes into account variations in the tap size in order to compensate for the voltage and temperature variations.

Figure 5:
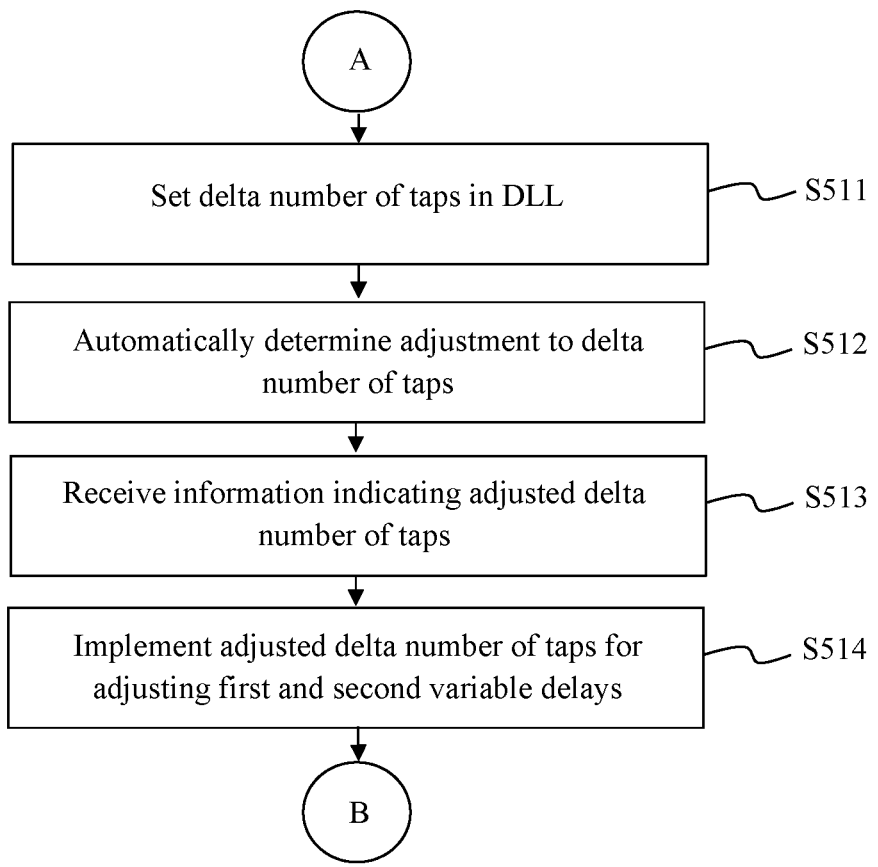
FIG. 5 is a flow diagram of a method for further compensating for voltage and temperature variations in a pseudo synchronous communication link, according to a representative embodiment.

FIG. 5 is a flow diagram of a method for further compensating for voltage and temperature variations in a pseudo synchronous communication link, according to a representative embodiment. The method may be implemented, for example, using the system 100 discussed above, including the first, second and third variable delay circuits 121, 122 and 123, and the DLL 130.

Referring to FIG. 5, in block S511, a delta number of taps is set in the DLL to provide the adjustment resolution. The adjustment resolution refers to the number of taps by which the DLL will adjust the tap sizes of the first and second variable delay circuits at a time without causing glitching. The delta number of taps may be based on the number of taps corresponding to the specified delay time equal to the time value of the UI.

In block S512, an adjustment to the delta number of taps is automatically determined by the delay tap monitor based on the adjusted number of taps as determined by the third variable delay circuit in block S415 of FIG. 4 (indicated by "A"). The adjustment comprises an increment or a decrement to be applied to the delta number of taps to be consistent with the adjusted number of taps. The adjusted delta number of taps may be determined, for example, according to Formula (1), discussed above.

In block S513, the DLL receives information from the delay tap monitor indicating the adjusted delta number of taps to maintain the adjustment resolution of the DLL. In block S514, the DLL implements the adjusted delta number of taps for the first and second variable delay circuits. The method then returns to FIG. 4 (indicated by "B") where the DLL may make adjustments to the number of the taps of each of the first and second variable delay circuits in block S417 in steps not exceeding the adjusted delta number of taps.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system for compensating for voltage and temperature variations in a pseudo synchronous communication link, the system comprising:
   a delay lock loop (DLL) in the pseudo synchronous communication link configured to perform eye tracking on a data signal, keeping a sample point of the data signal in a center of a data eye to provide data and clock recovery of the data signal in response to a common clock signal, wherein a unit interval (UI) of the data eye is defined as a reciprocal of a data rate of the data signal;
   wherein the DLL receives the data signal via a first variable delay circuit and a second variable delay circuit for implementing corresponding delays of the data signal, each of the first and second variable delay circuits having a plurality of taps for adjusting the corresponding delays, and each tap having a tap size providing a delay time per tap, wherein the tap size varies in response to the voltage and temperature variations;
   wherein the DLL maintains a delay separation of ½ of the UI between the corresponding delays of the first and second variable delay circuits by adjusting a number of taps of the first and second variable delay circuits, respectively, based on the tap size so that a difference between the corresponding delays is equal to the delay separation; and
   a delay tap monitor connected to the DLL and comprising another variable delay circuit having a plurality of taps, each tap having a tap size indicating a delay time per tap, wherein the tap size of the delay tap monitor varies in response to the voltage and temperature variations in substantially the same manner as the tap size of the first and second variable delay circuits varies in response to the voltage and temperature variations,
   wherein the delay tap monitor is configured to maintain a specified delay time equal to a time value of the UI by automatically adjusting a number of taps of the plurality of taps in the another variable delay circuit needed to provide the specified delay time as the tap size varies in response to the voltage and temperature variations,
   wherein the delay tap monitor provides to the DLL an adjusted number of taps corresponding to the specified delay time or ½ of the adjusted number of taps corresponding to the specified delay time, and
   wherein the DLL adjusts the number of taps of the first and second variable delay circuits, respectively, using the adjusted number of taps provided by the delay tap monitor to compensate for the voltage and temperature variations in order to maintain the delay separation of ½ of the UI between the corresponding delays of the first and second variable delay circuits.

2. The system of claim 1, wherein:
   the first variable delay circuit is configured to sample the data signal at the center of the data eye, and
   the second variable delay circuit acts as a phase detector configured to detect timing of transitions of the data signal relative to the center of the data eye.

3. The system of claim 2, wherein the DLL captures data from the data signal sampled via the first variable delay circuit, adjusting for the detected timing of transitions of the data signal relative to the center of the data eye provided by the second variable delay circuit.

4. The system of claim 1, wherein the DLL is further configured to provide a delta number of taps (DT) based on the number of taps corresponding to the specified delay time, wherein the delta number of taps defines adjustment resolution of the DLL.

5. The system of claim 4, wherein the delay tap monitor is further configured to provide an adjustment to the delta number of taps to the DLL based on the adjusted number of taps provided by the delay tap monitor to minimize adjustment resolution errors.

6. The system of claim 5, wherein the delay tap monitor provides the adjusted delta number of taps to the DLL.

7. The system of claim 6, wherein the adjusted delta number of taps is calculated according to Formula (1):

$$DT = \text{Max}\{\text{Floor}[\text{TapsPerUI}/32], 1\} \qquad (1).$$

8. The system of claim 5, wherein the DLL adjusts the number of taps of the first and second variable delay circuit in amounts equal to the delta number of taps provided by the delay tap monitor.

9. A method for compensating for voltage and temperature variations in a pseudo synchronous communication link, the method comprising:
- receiving a data signal over the pseudo synchronous communication link at a differential input of a delay locked loop (DLL) through first and second variable delay circuits, respectively, for performing eye tracking of the data signal at the DLL, keeping a sample point of the data signal in a center of a data eye, wherein a unit interval (UI) of the data eye is defined as a reciprocal of a data rate (1/data rate) of the data signal;
- initially determining a tap size for taps of the first and second variable delay circuits at an initial process, voltage and temperature (PVT) conditions;
- receiving a time value of the UI at a third variable delay circuit in a delay tap monitor, wherein the third variable delay circuit is substantially the same as the first and second variable delay circuits;
- automatically selecting a number of taps of the third variable delay circuit that provides a specified delay time equal to the time value of the UI based on the tap size of the taps;
- automatically adjusting the number of taps of the third variable delay circuit that provides the specified delay time equal in response to changes in the tap size of the third variable delay circuit, and outputting the adjusted number of taps;
- receiving information from the third variable delay circuit at the DLL about the adjusted number of taps, enabling the DLL to determine how many taps currently are equal to one half of the time value of the UI; and
- adjusting a number of the taps of each of the first and second variable delay circuits using the adjusted number of taps to maintain a delay separation of ½ of the UI between first and second delays of the first and second variable delay circuits, wherein adjusting the number of taps takes into account variations in the tap size of the first and second variable delay circuits in order to compensate for variations in voltage and temperature from the initial PVT conditions.

10. The method of claim 9, further comprising:
- dividing the adjusted number of taps output by the third variable delay circuit by two, wherein the information received from the third variable delay circuit at the DLL about the adjusted number of taps is one half of the adjusted number of taps.

11. The method of claim 9, wherein the information received from the third variable delay circuit at the DLL is the adjusted number of taps, which is divided by two by the DLL in order to obtain one half of the adjusted number of taps.

12. The method of claim 9, further comprising:
- sampling the data signal at the center of the data eye at the first variable delay circuit, and
- detecting timing of transitions of the data signal relative to the center of the data eye at the second variable delay circuit.

13. The method of claim 12, wherein the DLL captures data from the data signal sampled via the first variable delay circuit, adjusting for the detected timing of transitions of the data signal relative to the center of the data eye provided by the second variable delay circuit.

14. The method of claim 9, further comprising:
- providing a delta number of taps (DT) of the DLL based on the number of taps corresponding to the specified delay time, wherein the delta number of taps defines adjustment resolution of the DLL; and
- providing an adjustment to the delta number of taps from the delay tap monitor to the DLL based on the adjusted number of taps.

15. The method of claim 14, wherein the DLL adjusts the number of taps of the first and second variable delay circuit in amounts equal to the adjusted delta number of taps.

16. The method of claim 14, wherein providing the adjustment to the delta number of taps comprises determining an increment or a decrement to the delta number of taps.

17. The method of claim 16, wherein the adjusted delta number of taps is calculated according to Formula (1):

$$DT = \text{Max}\{\text{Floor}[\text{TapsPerUI}/32], 1\} \quad (1).$$

18. A system for compensating for voltage and temperature variations in a pseudo synchronous communication link, the system comprising:
- a first variable delay circuit connected to a delay lock loop (DLL) in the pseudo synchronous communication link, and configured to implement a first delay of a data signal input to the DLL, wherein the DLL is configured to perform eye tracking on the data signal, wherein a unit interval (UI) of a data eye is defined as a reciprocal of a data rate of the data signal;
- a second variable delay circuit connected to the DLL, and configured to implement a second delay of the data signal input to the DLL; and
- a third variable delay circuit connected to the DLL, and configured to maintain a specified delay time equal to a time value of one UI,
- wherein each of the first, second and third variable delay circuits has a plurality of taps for adjusting corresponding delays, and each tap has a tap size providing a delay time per tap, wherein the tap size varies in response to the voltage and temperature variations,
- wherein the third variable delay circuit automatically adjusts a number of taps of the plurality of taps needed to provide the specified delay time as the tap size varies in response to the voltage and temperature variations,
- wherein the third variable delay circuit provides to the DLL an adjusted number of taps corresponding to the specified delay time or ½ of the adjusted number of taps corresponding to the specified delay time, and
- wherein the DLL adjusts the number of taps of the first and second variable delay circuits, respectively, using the adjusted number of taps provided by the third variable delay circuit to compensate for the voltage and temperature variations in order to maintain a delay separation of ½ of the UI between the corresponding delays of the first and second variable delay circuits.

19. The system of claim 18, wherein:
- the first variable delay circuit is configured to sample the data signal at a center of the data eye, and
- the second variable delay circuit acts as a phase detector configured to detect timing of transitions of the data signal relative to the center of the data eye.

20. The system of claim 18, wherein the DLL is configured to adjust the number of taps of the first and second variable delay circuit in amounts equal to a delta number of taps based on the adjusted number of taps provided by the third variable delay circuit.

* * * * *